(12) United States Patent
Gotou et al.

(10) Patent No.: US 6,759,908 B2
(45) Date of Patent: Jul. 6, 2004

(54) HIGH FREQUENCY POWER AMPLIFIER

(75) Inventors: Seiki Gotou, Tokyo (JP); Akira Ohta, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/881,665

(22) Filed: Jun. 18, 2001

(65) Prior Publication Data

US 2002/0063603 A1 May 30, 2002

(30) Foreign Application Priority Data

Nov. 29, 2000 (JP) ........................................ 2000-362556

(51) Int. Cl.$^7$ ................................................. H03F 3/04
(52) U.S. Cl. ...................................... 330/302; 330/306
(58) Field of Search ................................ 330/302, 306, 330/310; 333/32, 33, 35, 263

(56) References Cited

U.S. PATENT DOCUMENTS

| | | | |
|---|---|---|---|
| 5,146,178 A | * | 9/1992 | Nojima et al. .............. 330/251 |
| 5,592,122 A | | 1/1997 | Masahiro et al. |
| 5,886,595 A | * | 3/1999 | Von Stein .................. 333/218 |
| 6,177,841 B1 | | 1/2001 | Ohta et al. |
| 6,262,641 B1 | * | 7/2001 | Kato et al. ................. 333/218 |

FOREIGN PATENT DOCUMENTS

| | | |
|---|---|---|
| JP | 6-204764 A | 7/1994 |
| JP | 7-22872 A | 1/1995 |
| JP | 2695395 B2 | 9/1997 |
| JP | 11-234062 A | 8/1999 |

* cited by examiner

*Primary Examiner*—Henry Choe
(74) *Attorney, Agent, or Firm*—Leydig Volt & Mayer, Ltd.

(57) ABSTRACT

A high frequency power amplifier that can improve efficiency of an operation of a transistor without limiting any input-side higher harmonic load of an impedance matching circuit to a short-circuit load, and can increase reflection of higher harmonics. By adjusting line lengths and line widths of signal lines, a 2nd harmonic can be adjusted to be an open load (a reflected phase angle of Γin: 0–90°, the quantity of reflection: 0.6–1.0), and a 3rd harmonic is adjusted to be a short-circuit load (the reflected phase angle of Γin: 110–270°, the quantity of reflection: 0.6–1.0). With this input-side higher harmonic load of the impedance matching circuit, efficiency of transistor operation can be improved. By disposing a higher harmonic processing circuit closer to a transistor, a high frequency power amplifier with a shortened line length between the higher harmonic processing circuit and the transistor, and increased quantity of reflection of higher harmonics is produced.

4 Claims, 4 Drawing Sheets

Phase angle of 2nd higher harmonics with respect to $\Gamma in$

HIGH FREQUENCY POWER AMPLIFIER

BACKGROUND OF THE INVENTION

1. Field of the Invention

The present invention relates to a high frequency power amplifier, and more specifically, to a high frequency power amplifier used in microwave or millimetric-wave telecommunications equipment for mobile communications or satellite communications.

2. Description of Related Art

In conventional high frequency power amplifiers used in microwave or millimetric-wave telecommunications equipment for mobile communications or satellite communications, it is well known that the efficiency of transistor operation is higher if the load at the frequencies of not only the fundamental waves but also higher harmonics of the output circuit of a transistor is controlled, as compared with the case where only the load of fundamental waves is controlled. Here, the fundamental waves are the waves that have the lowest frequency, and the higher harmonics are a series of waves, each of which has a frequency that is an integer multiple of the fundamental frequency.

It has been reported that there are the optimal load conditions for high-efficiency operation in input high frequency loads. For example, Japanese Patent No. 2695395 titled "High Frequency Power Amplifier" discloses that the control of input-side higher harmonics is effective for improving drain efficiency; the input-side higher harmonic control circuit has a resonance frequency with respect to frequencies lower than the frequency of the 2nd harmonic; there are optimal load conditions in the input impedance range of $(0+j4\Omega)$, $(0+j25\Omega)$, $(5+j25\Omega)$, and $(5+j4\Omega)$; and the efficiency of operation can be higher when the impedance of the 2nd harmonic is set in a low range. Here, higher harmonics, each of which has a frequency that is an odd-number multiple of the fundamental frequency, are called odd number higher harmonics; and higher harmonics, each of which has a frequency that is an even-number multiple of the fundamental frequency, are called even number higher harmonics.

Japanese Patent Laid-Open No. 7-22872 titled Electric Power Amplifier discloses that it is effective to make the load condition of input/output higher harmonics a short-circuit load in order to achieve high-efficiency operation in a hetero-junction bipolar transistor, and that, as in the above-described Japanese Patent No. 2695395, the efficiency of the transistor can be improved by setting a low impedance load. It is disclosed that there is no or little effect of odd number order higher harmonics, in particular of a 3rd higher harmonic.

As described above, conventional circuit configurations for realizing high efficiency operation of transistors in a high frequency power amplifier have a problem in that the circuit configurations are limited to make the input-side even-number higher harmonic load of the impedance matching circuit a short-circuit load.

Furthermore, such a high frequency power amplifier has a problem in that the higher the frequency of a signal, that is the higher the order of the harmonics, the smaller the amplitude of the higher harmonics reflected from higher harmonic processing circuit until the higher harmonics reach the input end of the transistor due to propagation loss in a line, and sufficient reflection cannot be obtained.

SUMMARY OF THE INVENTION

Therefore, an object of the present invention is to solve the above-described problems, and to provide a high frequency power amplifier that can improve the efficiency of transistor operation without limiting the input-side higher harmonic load of an impedance matching circuit to a short-circuit load.

Another object of the present invention is to provide a high frequency power amplifier that can increase the quantity of the reflection of higher harmonics.

According to a first aspect of the present invention, there is provided a high frequency power amplifier, comprising: a transistor for amplifying signals; and an input-side impedance matching circuit connected to an input side of the transistor, wherein the input-side impedance matching circuit makes impedance substantially open load with respect to even number order higher harmonics of a fundamental wave of a high frequency signal.

According to a second aspect of the present invention, there is provided a high frequency power amplifier, comprising: a transistor for amplifying signals; and an input-side impedance matching circuit connected to an input side of the transistor, wherein the input-side impedance matching circuit makes impedance substantially short-circuit load with respect to odd number order higher harmonics of a fundamental wave of a high frequency signal.

According to a third aspect of the present invention, there is provided a high frequency power amplifier, comprising: a front stage transistor; a rear stage transistor; and an inter-stage impedance matching circuit connected between the front stage transistor and the rear stage transistor for matching impedances, wherein higher harmonics generated in the front stage transistor is inputted into the rear stage transistor, and a higher harmonic load of the rear stage transistor is adjusted by the inter-stage impedance matching circuit.

According to a fourth aspect of the present invention, there is provided a high frequency power amplifier comprising a transistor for amplifying signals divided into cell units that operate in parallel, wherein each cell unit comprises an input-side impedance matching circuit and an output-side impedance matching circuit, and each cell unit adjusts a higher harmonic load of a basic frequency viewed from a direction of the transistor.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
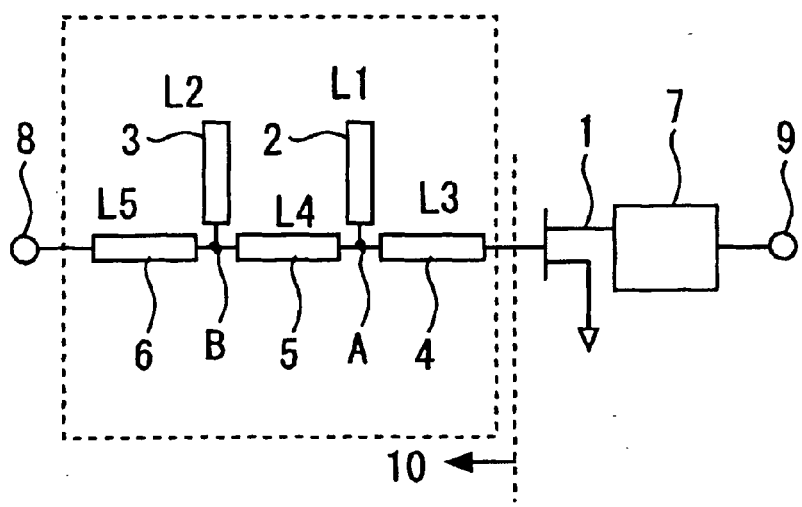
FIG. 1 shows a circuit configuration of a high frequency power amplifier in a First Embodiment of the present invention.

Embodiments of the present invention will be described below with reference to the accompanying drawings. It is noted that the same reference symbols in the drawings denote the same or corresponding components.

According to the investigation based on simulations and experiments by the inventors of the present invention, it was confirmed that when the output-side higher harmonic conditions of an impedance matching circuit was open load for even number order harmonics, and was short-circuit load for odd number order harmonics, higher efficiency could be achieved in a high frequency power amplifying circuit when the input-side 2nd (even number order) higher harmonic load of the impedance matching circuit was an open load or a high-impedance load. Furthermore, in the same case, it was confirmed that higher efficiency could be achieved when the input-side 3rd (odd number order) higher harmonic load was a short-circuit load or a low-impedance load. In the following description, an example of the circuit configurations of the present invention for optimizing the input-side higher harmonic load of the impedance matching circuit for elevating the efficiency of transistor operation will be described.

First Embodiment

FIG. 1 shows a circuit configuration of a high frequency power amplifier as a First Embodiment of the present invention. In FIG. 1 reference numeral 1 denotes a transistor, 2 denotes a first signal line (line length: L1, line width: W1), 3 denotes a second signal line (line length: L2, line width: W2), 4 denotes a third signal line (line length: L3, line width: W3), 5 denotes a fourth signal line (line length: L4, line width: W4), 6 denotes a fifth signal line (line length: L5, line width: W5), 7 denotes an output-side matching circuit, 8 denotes a signal input terminal, and 9 denotes a signal output terminal, if impedance is not matched in the middle or ends of signal lines 2–6 or the like, a part of the incident wave is reflected. The ratio of this reflected wave to the incident wave is called a reflection coefficient. In FIG. 1, reference numeral 10 denotes the reflection coefficient (Γin) when the input-side matching circuit is viewed from the direction of the transistor 1. In general, the voltage V(z) in the z-direction of the signal line that has a phase constant of β is represented by the following Equation 1.

$$V(z) = A\ exp(-j\beta z) + B\ exp(j\beta z) \quad (1)$$

where A and B are constants, the first term represents the incident wave, and the second term represents the reflected wave.

The ratio of the incident wave to the reflected wave, that is, the reflection coefficient Γ(1) is represented by the following Equation 2.

Equation 2

$$\Gamma(1) = |B/A|\ exp\ j(2\beta 1 + \theta) \quad (2)$$

where $|B/A|$ represents the quantity of reflection, and θ represents the phase angle.

As FIG. 1 shows, signal lines 4, 5, and 6 are connected in series, the signal line 2 is connected to the node A between signal lines 4 and 5, and the signal line 3 is connected to the node B between signal lines 5 and 6. By adjusting line lengths L1 to L5 and line widths W1 to W5 of the signal lines 2 to 6 shown in FIG. 1, the 2nd harmonic is adjusted to be an open load (the reflected phase angle of Γin: 0–90°, the quantity of reflection: 0.6–1.0), and the 3rd harmonic is adjusted to have a short-circuit load (the reflected phase angle of Γin: 110–270°, the quantity of reflection: 0.6–1.0).

Figure 2:
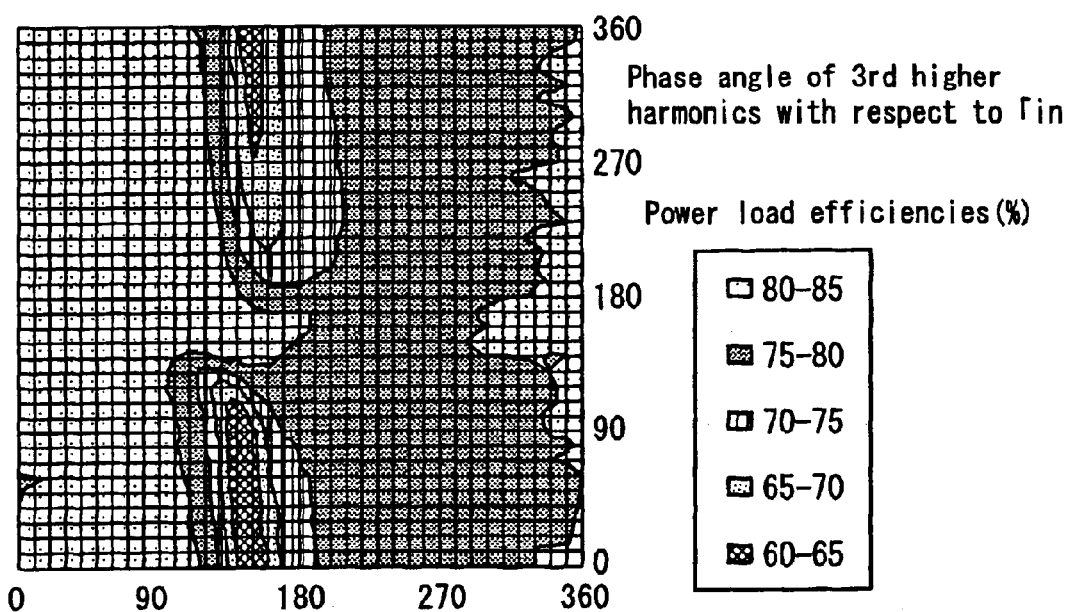
FIG. 2 shows the result of measurement of change in the power load efficiencies (%) for the phase angles θ of 2nd and 3rd higher harmonics with respect to the reflection coefficient Γin performed for the GaAs FET in First Embodiment of the present invention.

FIG. 2 shows the result of measurement of change in the power load efficiencies (%) for the phase angles θ of 2nd and 3rd higher harmonics with respect to the reflection coefficient Γin performed for the GaAs FET in First Embodiment of the present invention. As FIG. 2 shows, the power load efficiency of the 2nd higher harmonic with respect to the phase angle θ of the reflection coefficient Γin is as high as 80%–85% within the range of reflected phase angles θ=0–90°, and is as low as 60%–65% within the range of reflected phase angles θ=130–190°. The power load efficiency of the 3rd higher harmonic with respect to the phase angle θ of the reflection coefficient Γin is as high as 80%–85% within the range of reflected phase angles θ=110–270°. Especially for the 3rd higher harmonic, it is known that there is the effect of inhibiting the lowering of efficiency within the range of reflected phase angles θ=140–190° by the 2nd higher harmonic (130–190°).

According to the First Embodiment, as described above, by adjusting line lengths L1 to L5 and line widths W1 to W5 of the signal lines 2 to 6 in a high frequency power amplifying circuit shown in FIG. 1, the 2nd harmonic can be adjusted to be an open load (the reflected phase angle of Γin: 0–90°, the quantity of reflection: 0.6–1.0), and the 3rd harmonic is adjusted to be short-circuit load (the reflected phase angle of Γin: 110–270°, the quantity of reflection: 0.6–1.0). Therefore, by optimizing the input-side harmonic load of the impedance-matching circuit, the efficiency of transistor operation can be improved.

Second Embodiment

Figure 3:
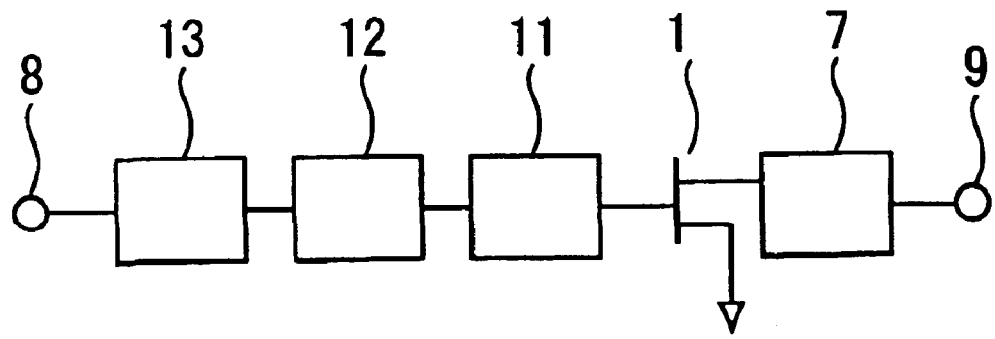
FIG. 3 shows a circuit configuration of a high frequency power amplifier in a Second Embodiment of the present invention.

FIG. 3 shows a circuit configuration of a high frequency power amplifier in Second Embodiment of the present invention. In FIG. 3, since the same reference numerals as used in FIG. 1 denote the same elements, no description will be made for such elements. In FIG. 3, reference numeral 11 denotes an input-side fundamental wave matching circuit, 12 denotes an input-side 2nd higher harmonic processing circuit, and 13 denotes an input-side 3rd higher harmonic reflecting circuit. As FIG. 3 shows, the input-side fundamental wave matching circuit 11, the input-side 2nd higher harmonic processing circuit 12, and the input-side 3rd higher harmonic reflecting circuit 13 are connected in series. In order to improve the operation efficiency of the transistor 1 using the higher harmonic processing circuit 12, the phase angle of reflection, as well as the quantity of reflection must be increased. In general, there is the problem that the higher the frequency of a signal, that is, the higher the order of higher harmonics, the smaller the amplitude of the higher harmonics reflected from the higher harmonic processing circuit 12 until the higher harmonics reach the input end of the transistor 1 due to propagation loss, and sufficient quantity of reflection cannot be obtained. However, as FIG. 3 shows, in the circuit configuration of the high frequency power amplifier in Second Embodiment of the present invention, the line length between the higher harmonic processing circuit 12 and the transistor 1 can be shortened, and the quantity of reflection of higher harmonics can be increased, by disposing the higher harmonic processing circuit 12 that processes the higher order higher harmonics closer to the transistor 1.

According to Second Embodiment, as described above, the line length between the higher harmonic processing circuit 12 and the transistor 1 can be shortened, and the quantity of reflection of higher harmonics can be increased, by disposing the higher harmonic processing circuit 12 that processes the higher order higher harmonics closer to the transistor 1.

Third Embodiment

Figure 4:
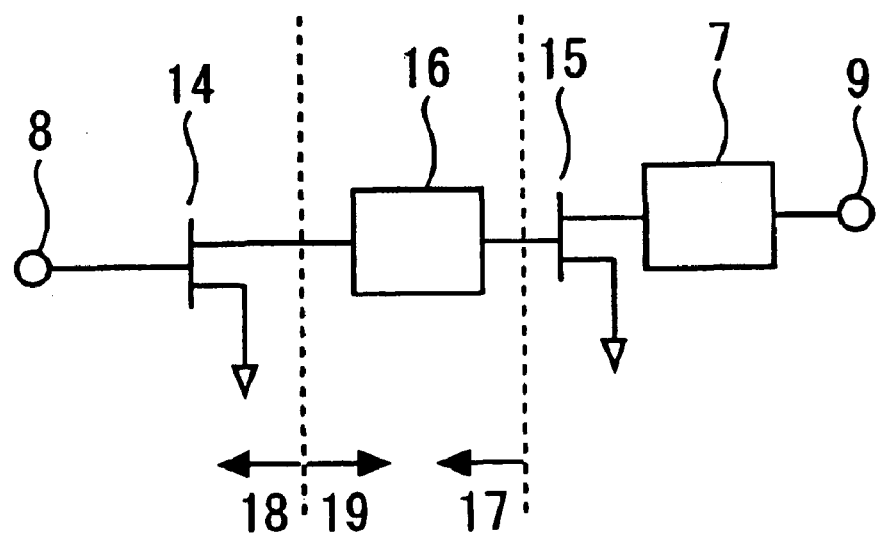
FIG. 4 shows a circuit configuration of a high frequency power amplifier in a Third Embodiment of the present invention.

FIG. 4 shows a circuit configuration of a high frequency power amplifier in Third Embodiment of the present invention. In FIG. 4, since the same reference numerals as used in FIG. 1 denote the same elements, no description will be made for such elements. In FIG. 4, reference numeral 14 denotes a front stage transistor, 15 denotes a rear stage transistor, 16 denotes an inter-stage matching circuit, 17 denotes an input-side reflection coefficient (Γin 1) viewed from the direction of the rear stage transistor 15, 18 denotes an output-side reflection coefficient (Γout 2) of the front stage transistor 14 viewed from the direction of the inter-stage matching circuit 16, and 19 denotes the reflection coefficient (Γ 2) of the front stage transistor 14 viewed from the direction of the inter-stage matching circuit 16.

As described above, higher harmonic loads are adjusted by reflection using a passive resonance circuit in the prior application. However, in Third Embodiment of the present invention, multiple stages of transistors are connected as FIG. 4 shows, and by inputting higher harmonics generated from the front stage transistor 14 of the multiple-stage amplifier into the rear stage transistor 15, the higher harmonic loads of the rear stage transistor 15 can be controlled to be highly efficient without using a higher harmonic reflecting circuit utilizing a resonance circuit.

The object of Third Embodiment is to operate the rear stage transistor 15, which has a large output, in high efficiency, and to make the rear stage transistor 15 operate together with the front stage transistor 14 at the A to AB class operating point to generate more higher harmonic components. The inter-stage matching circuit 16 performs the inter-stage matching of the front stage transistor 14 and the rear stage transistor 15, and matches their impedances for not only the fundamental wave but also higher harmonics to input higher harmonics generated in the front stage transistor 14 into the rear stage transistor 15. Since the load adjustment of the input-side higher harmonics of the rear stage transistor 15 is performed using higher harmonics actively generated in the front stage transistor 14, a larger quantity of reflection can be obtained compared with the case where higher harmonics generated in the input side of the rear stage transistor 15 are reflected as in First Embodiment. The higher harmonic loads (phase, amplitude), when the inter-stage matching circuit 16 is viewed from the direction of the rear stage transistor 15, are adjusted so that the efficiency of the rear stage transistor 15 becomes the maximum. Preferably, with respect to the reflection coefficient Γin 1 (17), the phase angle of the 3rd higher harmonic is 110–270°, and the quantity of reflection is 0.6–1.0.

Furthermore, with respect to higher harmonics of even number or odd number orders, impedance matching is performed using the inter-stage matching circuit 16 connected to the rear stage transistor 15 and to the front stage transistor 14. It is preferable that the high frequency generated from the front stage transistor 14 is inputted into the rear stage transistor 15, and the high-frequency load of the rear stage transistor 15 is adjusted as described above through the adjustment of the inter-stage matching circuit 16.

Figure 5:
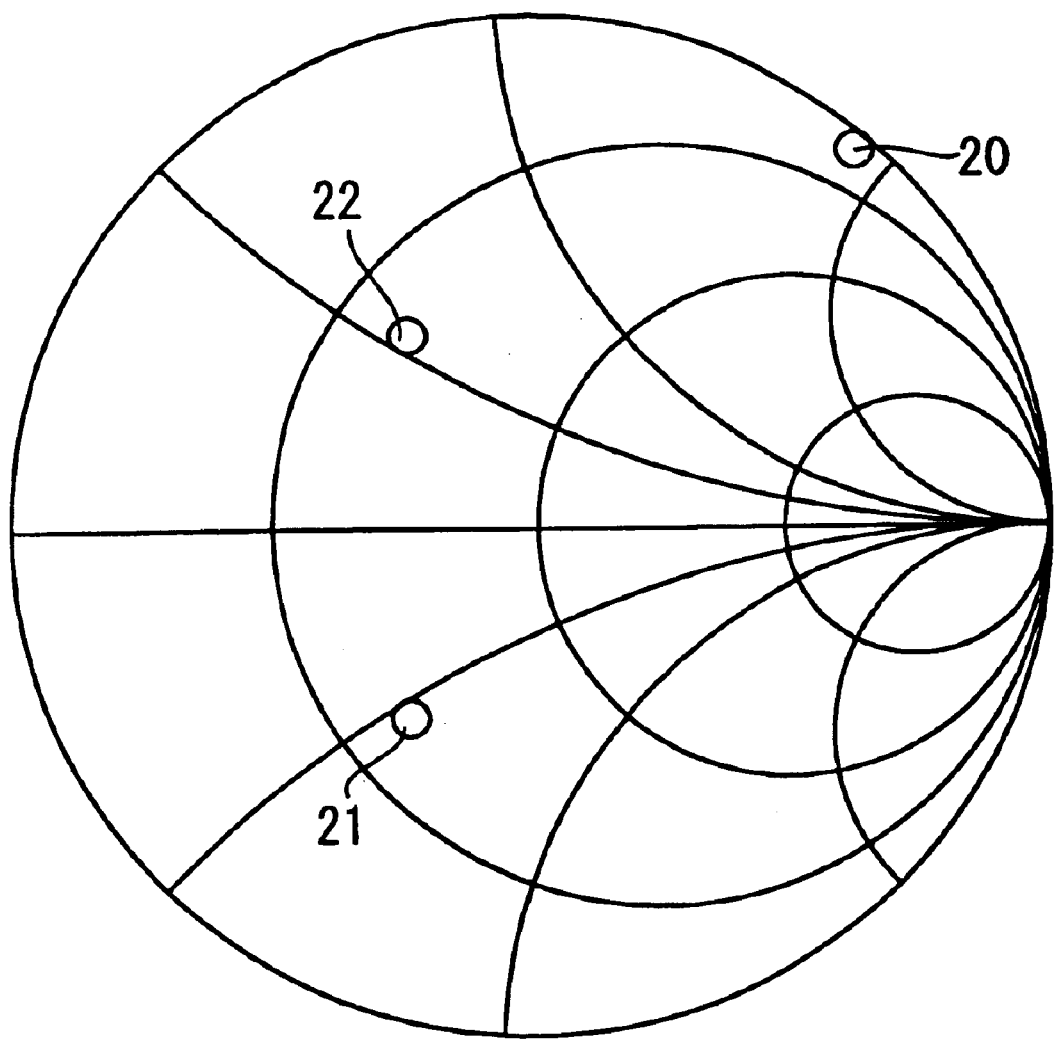
FIG. 5 shows loads on a Smith chart in Third Embodiment of the present invention.

FIG. 5 shows loads on a Smith chart in Third Embodiment of the present invention. In FIG. 5, the reference numeral 20 denotes the input-side 2nd higher harmonic load (Zin 1 (2 f 0)) viewed from the direction of the rear stage transistor 15 of FIG. 4, 21 denotes the output-side 2nd higher harmonic load (Zout 2 (2 f 0)) of the front stage transistor 14 viewed from the direction of the inter-stage matching circuit 16 of FIG. 4, and 22 denotes the 2nd higher harmonic load (Z 2 (2 f 0)) of the front stage transistor 14 viewed from the direction of the inter-stage matching circuit 16 of FIG. 4.

By the inter-stage matching circuit 16 of FIG. 4, the output-side 2nd higher harmonic load 21 of the front stage transistor 14 viewed from the direction of the inter-stage matching circuit 16, and the 2nd higher harmonic load 22 of the front stage transistor 14 viewed from the direction of the inter-stage matching circuit 16 are conjugated and matched; and the 2nd higher harmonic generated from the front stage transistor 14 is inputted into the rear stage transistor 15. Furthermore, by adjusting the line length of the inter-stage matching circuit 16 so as to match the load to the location of 17 in FIG. 4, highly efficient operation can be achieved.

According to Third Embodiment, as described above, the higher harmonic load of the rear stage transistor 15 can be controlled to be highly efficient without using a higher harmonic reflecting circuit utilizing a resonance circuit, by connecting multiple stages of transistors and inputting higher harmonics generated from the front stage transistor 14 of a multiple-stage amplifier into the rear stage transistor 15.

Fourth Embodiment

Figure 6:
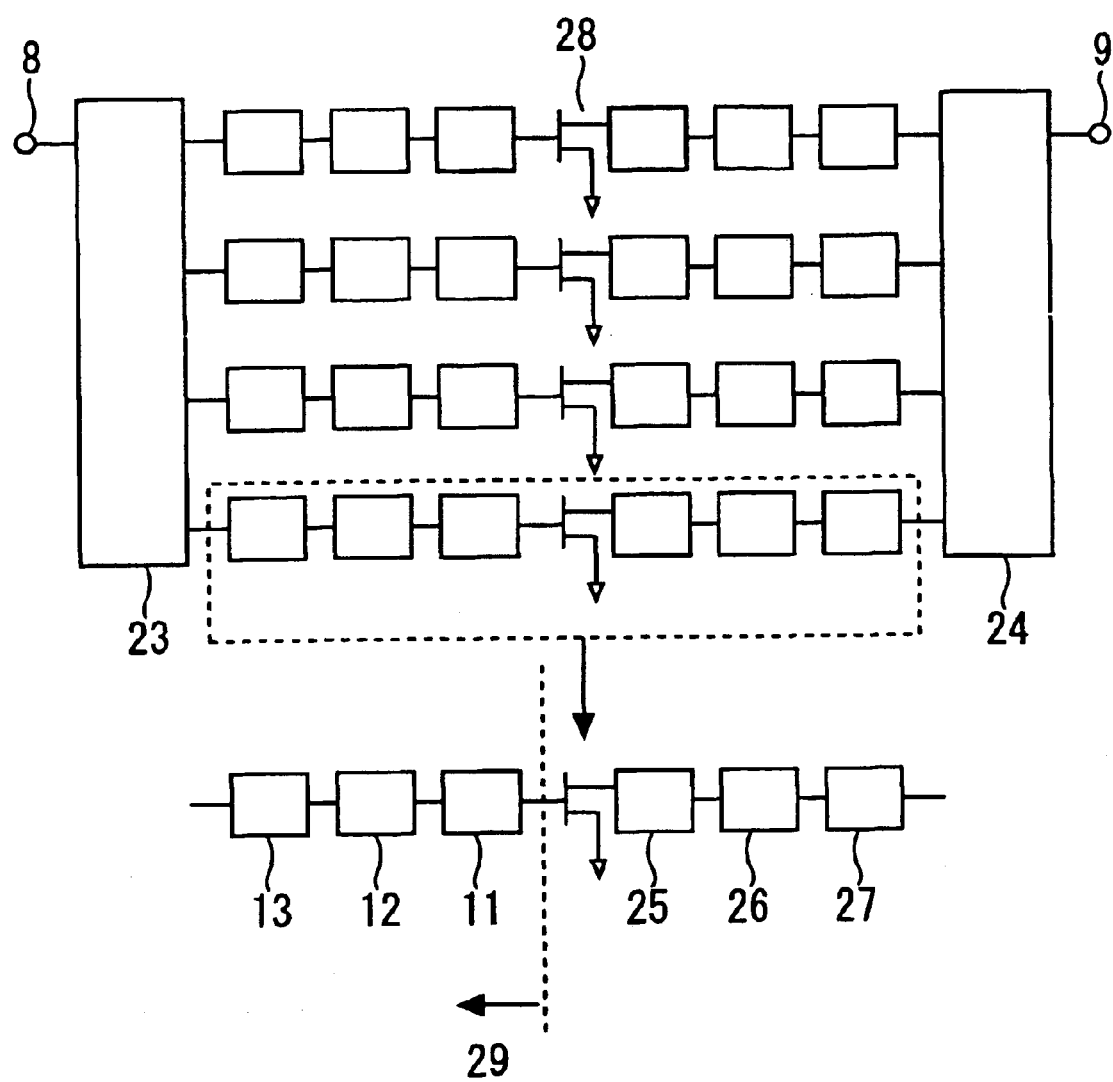
FIG. 6 shows a circuit configuration of a high frequency power amplifier in Fourth Embodiment of the present invention.

FIG. 6 shows a circuit configuration of a high frequency power amplifier in Fourth Embodiment of the present invention. In FIG. 6, since the same reference numerals as used in FIGS. 1 or 3 denote the same elements, no description will be made for such elements. In FIG. 6, reference numeral 23 denotes an electric power distributing circuit, 24 denotes an electric power combining circuit, 25 denotes an output-side 3rd higher harmonic processing circuit, 26 denotes an output-side 2nd higher harmonic processing circuit, 27 denotes an output-side fundamental wave matching circuit, 28 denotes transistors divided into cell units, and 29 denotes the load of the input-side matching circuit (Zinc) viewed from the direction of transistors divided into cell units.

When the input/output load of a transistor lowers, the load of the input/output matching circuit for matching this lowers, and the quantity of reflection of the fundamental wave increases. Therefore, the quantity of reflection of higher harmonics corresponding to the fundamental wave lowers. In Fourth Embodiment of the present invention, in order to increase the quantity of reflection of higher harmonics, transistors operating in parallel to the load of the fundamental wave are divided into cell units (28) to adjust the higher harmonic load of the input/output matching circuit 11 for each cell unit so as to be highly efficient. By combining units each containing a transistor cell 28 and an input/output matching circuit 11 in parallel using the electric power distributing circuit 23 and the electric power combining circuit 24 to increase the quantity of reflection of higher harmonics viewed from the direction of each transistor cell 28, the quantity of reflection of higher harmonics required for elevating the efficiency of the transistors 28 can be obtained. Since the variation of higher harmonic loads viewed from the direction of each transistor cell 28 can be minimized compared with the case where the higher harmonic processing circuit is formed without dividing the transistor, lowering of efficiency due to the uneven operation of each transistor can be prevented.

According to Fourth Embodiment, as described above, transistors operating in parallel to the load of the fundamental wave are divided into cell units to adjust the higher harmonic load of the input/output matching circuit 11 for each cell unit so as to be highly efficient. Therefore, since the variation of higher harmonic loads viewed from the direction of each transistor cell 28 can be minimized compared with the case where the higher harmonic processing circuit is formed without dividing any transistor, lowering of efficiency due to the uneven operation of each transistor can be prevented.

According to the high frequency power amplifier of the present invention, as described above, the efficiency of the operation of a transistor can be improved without limiting the input-side higher harmonic load of an impedance matching circuit to the short-circuit load, by optimizing the input-side higher harmonic load of the impedance matching circuit.

Furthermore, by disposing the higher harmonic processing circuit 12 of higher orders closer to the transistor 1, there is provided a high frequency power amplifier with the shortened line length between the higher harmonic processing circuit 12 and the transistor 1, and increased quantity of reflection of higher harmonics.

In the high frequency power amplifier, a phase angle of reflection of a second higher harmonic may be 0 to 90 degrees, and a quantity of reflection may be 0.6 to 1.0, with respect to a reflection coefficient when the input-side impedance matching circuit is viewed from a direction of an input end of the transistor.

In the high frequency power amplifier, a phase angle of reflection of a third higher harmonic may be 110 to 270 degrees, and a quantity of reflection may be 0.6 to 1.0, with respect to a reflection coefficient when the input-side impedance matching circuit is viewed from a direction of an input end of the transistor.

In the high frequency power amplifier, the input-side impedance matching circuit may comprise a third higher harmonic reflecting circuit, a second higher harmonic processing circuit, and a fundamental wave matching circuit, disposed sequentially from a side of a signal input terminal.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 2000-362556 filed on Nov. 29, 2000 including specification, claims, drawings and summary are incorporated herein by reference in its entirety.

What is claimed is:

1. A high frequency power amplifier, comprising:
   a transistor for amplifying signals and having an input side; and
   an input-side impedance matching circuit connected between the input side of said transistor and a signal input terminal of the amplifier, wherein said input-side impedance matching circuit provides an impedance of a substantially open circuit load with respect to even number higher harmonics of a fundamental wave of a high frequency signal and comprises a third harmonic reflecting circuit, a second harmonic processing circuit, and a fundamental wave matching circuit, disposed sequentially from the signal input terminal.

2. The high frequency power amplifier according to claim 1, wherein a phase angle of reflection of a second harmonic is 0 to 90 degrees, and reflection is 0.6 to 1.0, with respect to a reflection coefficient when said input-side impedance matching circuit is viewed from the input side of said transistor.

3. A high frequency power amplifier, comprising:
   a transistor for amplifying signals and having an input side; and
   an input-side impedance matching circuit connected between the input side of said transistor and a signal input terminal of the amplifier, wherein
      said input-side impedance matching circuit provides an impedance of a substantially short-circuit load with respect to odd number harmonics of a fundamental wave of a high frequency signal; and
      a phase angle of reflection of a third harmonic is 110 to 270 degrees, and reflection is 0.6 to 1.0, with respect to a reflection coefficient when said input-side impedance matching circuit is viewed from the input side of said transistor.

4. The high frequency power amplifier according to claim 3, wherein said input-side impedance matching circuit comprises a third harmonic reflecting circuit, a second harmonic processing circuit, and a fundamental wave matching circuit, disposed sequentially from the signal input terminal.

* * * * *